H. W. HENKELS

OSCILLATORY CIRCUIT AND MONOLITHIC SEMICONDUCTOR DEVICE THEREFOR

Filed July 2, 1962

United States Patent Office 3,284,723

Patented Nov. 8, 1966

3,284,723

OSCILLATORY CIRCUIT AND MONOLITHIC SEMICONDUCTOR DEVICE THEREFOR

Herbert W. Henkels, deceased, late of Rockwood, Pa., by Patricia Henkels, administratrix, Rockwood, Pa., assignor to Westinghouse Electric Corporation, East Pittsburgh, Pa., a corporation of Pennsylvania Filed July 2, 1962, Ser. No. 207,127

4 Claims. (Cl. 331—107)

The present invention relates to electrically oscillatory arrangements and more particularly to such arrangements which include semiconductive regions interrelated in monolithic form.

There are, of course, numerous combinations of circuit elements which, when interconnected in prescribed relation, become oscillatory to provide an alternating voltage or current output. Where miniaturization and reliability and other equally important advantages are sought as objectives, it is desirable to provide an oscillator in such form as to comprise a combination of semiconductive regions in monolithic or unitary form either with or without other circuit elements. As a qualitative guidepost, such a molecularized oscillator can and ought to be so formed as to provide efficiently those interrelated functions determined to be necessary to lead to an oscillatory output, and little or no conceptual reliance need be placed on traditional modes of approach.

Thus, it is an object of the invention to provide an arrangement including semiconductive regions embodied in a monolithic device so as to produce an oscillatory output voltage or current.

It is another object of the invention to provide an arrangement including semiconductive regions which are so interrelated as to provide a bistable switch and to provide a load for electrically filtering and damping the switch output and thereby a stable oscillatory operation of the arrangement.

These and other objetcs of the invention will become more apparent upon consideration of the following detailed description along with the attached drawing, in which.

In accordance with the broad principles of the invention, an oscillatory arrangement includes a semiconductor device having monolithic semiconductive regions which are so arranged and correlated as to enable the device to operate as a critically loaded bistable switch. Upon energization, the device oscillates into and out of one of its stable states. To clarify these principles, the detailed description of an exemplary embodiment of the invention will now be set forth.

Figure 1:
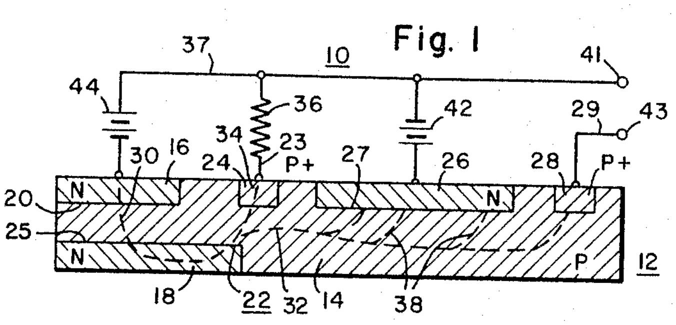
FIGURE 1 is a longitudinally sectioned view of a semiconductor device along with other schematically represented elements so interrelated as to provide an oscillatory arrangement in accordance with the principles of the invention.

With reference to FIGURE 1, there is illustrated an oscillatory arrangement 10 formed in accordance with the principles of the invention. The arrangement 10 includes an elongated semiconductive block 12 which is so formed, in a manner which will subsequently be described more fully, as to have a plurality of regions of differing conductivity type. Although the various regions are shown here as completely forming the block 12, they may form a portion of a monolithic block or device which operates as a larger system having functions of wider scope.

A presentation of the geometric or monolithic character of the block 12 at this point in the description will aid in understanding the electrically operative aspects of the oscillatory arrangement 10. Thus, the block 12 includes an elongated body region 14 of one conductivity type, p as exemplified in this instance, an elongated emitter region 16 for carrier injection and an elongated floating region 18 for carrier collection, with each of the latter regions being of n-type conductivity in this instance and crystally adjoining an associated portion of the body region 14 in a first zone of the block 12 adjacent one end thereof. By "crystally adjoining," it is meant that the regions form adjoining or contacting regions in a crystalline body.

Accordingly, elongated p-n junctions 20 and 22 are formed between the body region 14 and the emitter region 16 and the floating region 18, respectively. For reasons which will subsequently become more apparent, it is desirable that the p-n junctions 20 and 22 be spaced from each other an amount which does not exceed 10 diffusion lengths, and, preferably, an amount which is less than one diffusion length to enable carriers injected by the emitter 16 into the body 14 to diffuse for collection by the floating region 18 through the junction 22.

Means, including a contacting portion 24 of p+ conductivity type, are provided for enabling a lead 23 to be attached in ohmic nonrectifying relation to the body 14, in a location laterally and inwardly spaced from the emitter 16. In this example of the invention, it is preferred that the contacting portion 24 be spaced from the emitter region 16 a distance which is substantially greater than the distance between the junctions 20 and 22, again for reasons which will subsequently become more apparent.

The block 12 also includes a region 26 for producing a capacitive effect and it is exemplarly located on the same side of the block 12 as the emitter 16 is located. The region 26 is, consistently with this example, provided with n-type conductivity. The capacitive effect occurs across a p-n junction 27 between the region 26 and the associated portion of the body 14 which together form a second zone of the block 12.

Adjacent the other end of the block 12 means, including a contact portion 28 of p+ type conductivity, are provided for enabling an output lead 29 to be attached in ohmic nonrectifying relation to the body 14. In this instance, the contact portion 28 is also provided on the emitter side of the block 12.

The solid state operational character of the oscillatory arrangement 10 can now be more readily determined. Thus, the oscillatory arrangement 10 includes means switchable from one stable state to another in the form of an npnp (or pnpn) "four layer" diode switch being operative over a representative serial path indicated by the dotted line 30 through the regions 16, 14, 18 and reflectively through the region 14. Thus, the region 18 is in "floating" relation with the other regions of the mentioned switch means. By spacing the contact portion 24 from the emitter 16 as previously described, the path 30 is the preferred path for current flow or carrier movement rather than the generally straight line path from the emitter 16 through the body 14 to the contacting portion 24.

Figure 3:
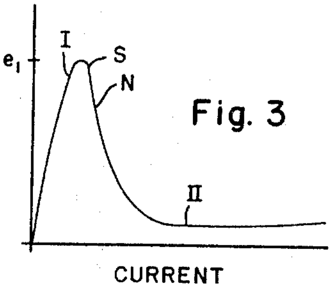
FIG. 3 depicts a voltage-current curve for the arrangement of FIG. 1.
Figure 7:
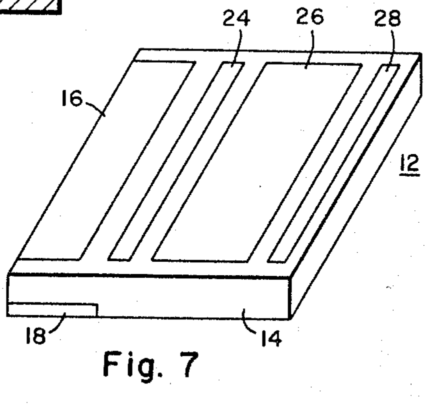
FIG. 7 is a perspective view of the wafer of FIG. 1 in its substantially completed form.

The operation of an npnp or pnpn switch is well known in the pertaining art and a brief description of its operation will suffice here to point out the principles of the invention. As viewed in FIGURE 3, the exemplified switch is characterized with an operating curve S having separate portions I and II which denote respective stable current-voltage states of switch operation. The curve S also has a portion N which connects the portions I and II and which denotes a negative resistance state of switch operation. When the voltage across the switch, as produced by a voltage source or battery 44 attains a critical value $e_1$, the switch proceeds from its stable current-voltage state I, which is substantially non-conductive, to its stable current-voltage state II which is highly conductive.

On a functional basis, the reason for this mode of operation is that, below the critical voltage $e_1$, a portion 25 of the p-n junction 22 opposite the emitter p-n junction 20 is reversely biased to inhibit current flow while at or slightly above the critical voltage $e_1$, minority carriers cross the p-n junction portion 25 to offset the reverse bias across the p-n junction portion 25 and enable greater carrier movement through the switch until stability is obtained in the conductive state II. If there is provided an independent control voltage across or current through the p-n junction portion 25, varied magnitudes of the control parameter provide varied switching conditions.

To continue with the description of the operative aspects of the oscillatory arrangement 10, the path 30 branches into representative paths 32 and 34. The path 34 connects with resistance means in the form of an external resistor 36 which is connected between the lead 23 and an output lead 37. The path 32 extends through the resistive material of the body region 14 to the contacting portion 28 and the lead wire 29. In addition, branches 38 flare outwardly from the path 32 toward the p-n junction 27 in representation of paths for generally capacitive components of current. Thus, current through the switch path 30 is impeded by loading in each of the paths 32 or 34.

The desired capacity across the p-n junction 27 is obtained through the use of a voltage source 42 which reversely biases the p-n junction 27 so as to form a carrier depleted layer. Accordingly, the depleted layer behaves as a dielectric separating opposed plates of a capacitor, and the capacitive effect is distributed over the area of the p-n junction 27. Such parameters as the surface area of the p-n junction 27 and the voltage of the voltage source 44 are determinative of the amount of capacity obtained.

The voltage source 44 is included serially between the output lead 37 and the switch path 30 to provide the energy for oscillation of the arrangement 10. As previously described, if the voltage source 44 produces a voltage of a value $e_1$ or greater across the switch path 30, the latter will be urged from its stable state I toward its other stable state II. If the load effect upon the switch path 30 is characterized with a suitable voltage-current curve (not shown), the switch current is decreased below the holding value and the arrangement 10 enters into a state of oscillation with the switch voltage and current repeatedly varying in magnitude preferably along the switch curve negative resistance portion N. By suitable design, the resistive effect of the loading placed on the switch path 30 by the resistive means 36 and the body path 32, as well as other load producing items, can, in combination, suitably generate the load curve just described.

It is believed that the oscillatory operation of the arrangement 10 is as follows, but presentation of this operational theory is made only for clarity and not as a limitation on the invention. Thus, when the arrangement 10 is first connected for operation, the voltage of the battery 44 is impressed across the switch path 30 in series with parallel load paths 32 and 34 and in very short time the battery voltage is divided such that voltage $e_1$ exists across the switch path 30 and the balance of the battery voltage appears across parallel load paths 32 and 34. At this circuit condition, the switch current magnitude equals that observable in FIG. 3 as corresponding to the ordinate value $e_1$ on the switch curve S, and this switch current magnitude clearly equals the magnitude of the vectorial sum of resistive and capacitive currents through the load paths 32 and 34. Further, the current magnitude satisfies the noted load curve in that it corresponds to the load path voltage magnitude which when summed with the switch voltage $e_1$ equals the battery voltage.

At the circuit condition just described, however, the switch path 30 is in an unstable condition and switch voltage and current therefore change in accordance with the descending switch curve negative resistance portion N. During this change period, load path current is of course always equal to switch current, and load path voltage increases as switch voltage decreases so that Kirchhoff circuit voltage conditions are met. Eventually, further increase in current is prohibited by the fact that load path voltage no longer can increase in balance with the decreasing switch voltage. Physically, this can be because the circuit capacitance across junction 27 is approaching full charge so that load paths 32 and 34 cannot accommodate any further current increase without unbalancing circuit voltage conditions.

Accordingly, at this point in time, current is caused to decrease and it does so with switch voltage rising along switch curve portion N. This return swing continues until the switch voltage again approaches the magnitude $e_1$. A new cycle is then begun and oscillations continue until the circuit is deenergized. The frequency of oscillation is determined by the character of the switch and load curves which, in turn, depend upon factors including the geometry of the block 12.

When an oscillatory state is obtained as just described, the resulting fluctuating voltage across output terminals 41 and 43 preferably differs from the fluctuating switch or load path voltage, particularly in that undesired frequency components of the switch current are shunted principally through the paths 38. The fluctuating or oscillatory output voltage can thus have a substantially sinusoidal wave form of a desired frequency if the dimensional and other parameters of the arrangement 10 are suitably provided.

Figure 2:
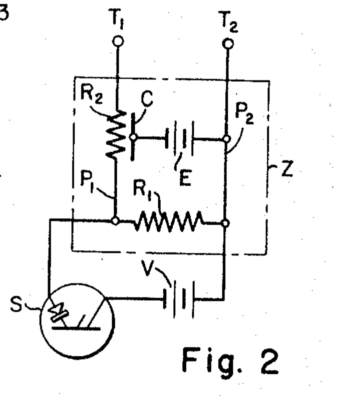
FIG. 2 is a schematic diagram of a circuit which is generally equivalent to the electrically operative character of the arrangement of FIG. 1.
Figure 4:
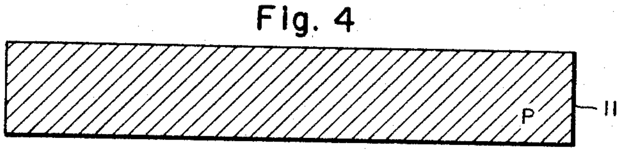
FIG. 4 is a longitudinally sectioned view of a semiconductive wafer from which the semiconductor device in the oscillatory arrangement of FIG. 1 can be formed.
Figure 5:
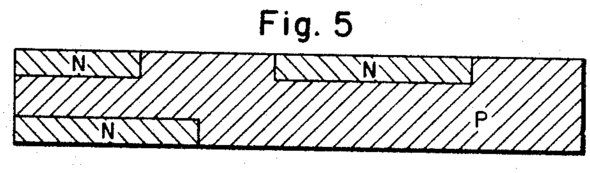
FIG. 5 is a longitudinally sectioned view showing the wafer of FIG. 4 after one formative step.
Figure 6:
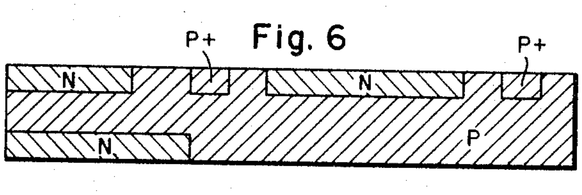
FIG. 6 is a longitudinally sectioned view of the wafer of FIG. 1 after a second formative step.

For the purpose of clarifying the electrical relations described in connection with FIGURE 1, a circuit which is substantially equivalent to the oscillatory arangement 10 is depicted in FIGURE 2. Thus, a bistable switch S is serially connected with a voltage source V and serially through a load Z. The load Z includes a resistor $R_1$ in series with the source V and the switch S, and a pair of output paths $P_1$ and $P_2$ are connected to opposite ends of the resistor $R_1$. The path $P_1$ includes a resistor $R_2$ along the length of which a distributed capacitive effect is provided by a capacitor plate C. A battery E is connected serially between the capacitor plate C and the path $P_2$.

Thus, the load Z provides a net filtering and loading effect upon the bistable switch S so as to enable the equivalent circuit of FIGURE 2 to oscillate, similar to the manner in which the arrangement 10 oscillates, and to provide an output voltage across terminals T1 and T2 of desired form and frequency.

The formative steps which can be employed in preparing the block 12 in its final form shown in FIGURE 1 are illustrated in FIGURES 4 through 7. Thus, in FIGURE 4 a wafer 11 is provided as a single crystal, in this example a semiconductive material of p-type conductivity such as suitably doped silicon or germanium or a suitably doped stoichiometric compound of elements of Group III and Group V of the periodic table. An acceptable stoichiometric compound may be, for example, indium arsenide, indium antimonide, gallium arsenside, or gallium antimonide.

The doped wafer 11 can be prepared by any of the well-known methods in the pertaining art. For example, a single crystal rod may be pulled from a melt comprised of silicon and at least one element from Group III of the periodic table, for example, indium gallium, aluminum or boron. The wafer 11 is then cut from the rod with, for example, a diamond saw. The surfaces of the wafer 11 may then be lapped or etched or both to produce a smooth surface after sawing. The wafer 11 can also be formed from a dendrite which can be prepared in accordance with U.S. Patent 3,031,403 of A. Bennett, issued April 24, 1962, entitled, "Process For Producing Crystals and the Product Thereof," and assigned to the present assignee.

In order to form the emitter region 16, and the floating region 18 and the region 26, diffusion or alloying techniques may be employed. For example, the semiconductive wafer 11, being suitably masked, can be positioned in a hot zone of a diffusion furnace where the temperature is within the range of 1100° C. to 1200° C. and where there is provided an atmosphere of a vapor of a donor dopant from Group V of the periodic table, for example arsenic, antimony or phosphorus. A crucible containing the donor dopant is positioned in another zone of the furnace where the crucible temperature can be provided within the range of 600° C. to 1200° C., with the vapor pressure and surface concentration of the dopant over the wafer 11 being a function of the selected temperature. Over a predetermined period of time, the donor dopant diffuses to the desired depth through the entire surface or the unmasked surface portion of the p-type silicon wafer 11.

After the diffusion process just considered and any necessary etching operations are completed, the regions 16, 18 and 26 and the p-n junctions 20, 22 and 27 will have been formed with the desired geometry. Next, the contacting portions 24 and 28 can be formed by a second diffusion process, conducted in a manner similar to the first one but using instead an acceptor dopant. Of course, in each diffusion process, suitable controls are provided so as to insure proper dopant concentration and diffusion depth. In the case of the contacting portions 24 and 26, the concentration of the employed acceptor dopant is considerably greater than the concentration of the acceptor dopant in the body region 14 of the wafer 11. After completion of the second diffusion process, the wafer 11 is in its final form as illustrated cross-sectionally in FIGURE 6 and perspectively in FIGURE 7, and various leads need only be bonded to the wafer 11 to provide the semiconductor block 12 of FIG. 1.

In the foregoing description, an oscillatory arrangement including semiconductive regions has been described only to illustrate the principles of the invention. Accordingly, it is desired that the invention be not limited to the described embodiment, but rather that it be interpreted in accordance with the scope and spirit of its broad principles.

What is claimed is:

1. A monolithic semiconductive device suitable for use in an oscillatory circuit, said device comprising a plurality of monolithic semiconductive regions, one of said regions being a body region of one conductivity type, a second of said regions forming an emitter of the other conductivity type crystally adjoined with a first zone of said body region adjacent one side thereof, a third of said regions of said other conductivity type crystally adjoined with said body region first zone adjacent a side opposite said one side, said second region and a first portion of said first zone of said body region and said third region and a second portion of said first zone of said body region cooperatively forming respective layers of a four layer bistable diode switch, and loading and filter means including a second zone of said body region for capacitively and resistively loading said switch.

2. An electrically oscillatory arrangement comprising a semiconductor device having a plurality of monolithic semiconductive regions, one of said regions being a body region of one conductivity type, a second of said regions forming an emitter of the other conductivity type crystally adjoined with a first zone of said body region adjacent one side thereof, a third of said regions of said other conductivity type crystally adjoined with said body region first zone adjacent a side opposite said one side, said second region and a first portion of said first zone of said body region and said third region and a second portion of said first zone of said body region cooperatively forming respective layers of a four layer bistable diode switch, means for energizing said switch so as to urge the latter from one stable state to another stable state, and loading and filter means including a second zone of said body region for capacitively and resistively loading said switch to urge the latter toward said one stable state when said switch is urged therefrom by said energizing means thereby to produce a filtered oscillatory output.

3. An electrically oscillatory arrangement comprising a semiconductor device having a plurality of monolithic semiconductive regions, one of said regions being a body region of one conductivity type, a second of said regions forming an emitter of the other conductivity type crystally adjoined with a first zone of said body region adjacent one side thereof, a third of said regions of said other conductivity type crystally adjoined with said body region first zone adjacent a side opposite said one side, said second region and a first portion of said first zone of said body region and said third region and a second portion of said first zone of said body region cooperatively forming respective layers of a four layer bistable diode switch, means for energizing said switch so as to urge the latter from one stable state to another stable state, and loading and filter means for capacitively and resistively loading said switch to urge the latter toward said one stable state when said switch is urged therefrom by said energizing means thereby to produce a filtered oscillatory output, said loading and filter means including a second zone of said body region providing a resistive path coupled with said second portion of said first zone of said body region and including a fourth region of said other conductivity type crystally adjoined with said body region second zone to provide for a distributed capacitive effect along a portion of said resistive path.

4. An electrically oscillatory arrangement comprising a semiconductor device having a plurality of semiconductive regions, one of said regions being a body region of one conductivity type, a second of said regions forming an emitter of the other conductivity type crystally adjoined with a first zone of said body region adjacent one side thereof, a third of said regions of said other conductivity type crystally adjoined with said body region first zone adjacent a side opposite said one side, said second region and a first portion of said first zone of said body region and said third region and a second portion of said first zone of said body region cooperatively forming respective layers of a four layer bistable diode switch, means for energizing said switch so as to urge the latter from one stable state to another stable state, and loading and filter means for capacitively and resistively loading said switch to urge the latter toward said one stable state when said switch is urged therefrom by said energizing means thereby to produce a filtered oscillatory output, said loading and filter means including a second zone of said body region providing a resistive path coupled with said second portion of said first zone of said body region and including a fourth region of said other conductivity type crystally adjoined with said body region second zone to provide for a distributed capacitive effect along a portion of said resistive path, said loading and filter means also including a contacting portion in non-rectifying relation with said body region on said one side thereof intermediately of said body region first and second zones and including an external resistor serially connected therewith.

References Cited by the Examiner

UNITED STATES PATENTS

| | | | |
|---|---|---|---|
| 3,090,873 | 5/1963 | Mackintosh | 307—88.5 |
| 3,110,870 | 11/1963 | Ziffer | 307—88.5 |
| 3,115,581 | 12/1963 | Kilby | 307—88.5 |
| 3,118,114 | 1/1964 | Barditch | 333—70 |

OTHER REFERENCES

Electronics: "Function-Oriented Approaches," November 1960, pp. 99 to 104.

ROY LAKE, *Primary Examiner.*

J. KOMINSKI, S. H. GRIMM, *Assistant Examiners.*